(12) United States Patent
Wang et al.

(10) Patent No.: US 10,586,738 B2
(45) Date of Patent: Mar. 10, 2020

(54) METHOD OF PROVIDING SOURCE AND DRAIN DOPING FOR CMOS ARCHITECTURE INCLUDING FINFET AND SEMICONDUCTOR DEVICES SO FORMED

(71) Applicant: Samsung Electronics Co., Ltd., Gyeonggi-do (KR)

(72) Inventors: Wei-E Wang, Austin, TX (US); Mark S. Rodder, Dallas, TX (US); Borna J. Obradovic, Leander, TX (US); Joon Goo Hong, Austin, TX (US)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 95 days.

(21) Appl. No.: 15/877,931

(22) Filed: Jan. 23, 2018

(65) Prior Publication Data

US 2019/0131182 A1    May 2, 2019

Related U.S. Application Data

(60) Provisional application No. 62/577,555, filed on Oct. 26, 2017.

(51) Int. Cl.
*H01L 21/8238* (2006.01)
*H01L 27/092* (2006.01)
(Continued)

(52) U.S. Cl.
CPC ........... *H01L 21/823814* (2013.01); *H01L 21/02057* (2013.01); *H01L 21/2257* (2013.01);
(Continued)

(58) Field of Classification Search
CPC ....... H01L 21/823814; H01L 21/02057; H01L 21/2257; H01L 21/2686; H01L 21/324;
(Continued)

(56) References Cited

U.S. PATENT DOCUMENTS 7,687,338 B2   3/2010   Jain et al.
7,767,579 B2   8/2010   Chakravarti et al.
(Continued)

OTHER PUBLICATIONS

Auth, "45nm High-k + metal gate strain-enhanced transistors," 2008, pp. 128-129.
(Continued)

*Primary Examiner* — Zandra V Smith
*Assistant Examiner* — Andre C Stevenson
(74) *Attorney, Agent, or Firm* — Van Pelt, Yi & James LLP

(57) ABSTRACT

A method for providing a semiconductor device and the device so formed are described. A doped semiconductor layer is deposited on a semiconductor underlayer. At least a portion of the semiconductor underlayer is exposed. A dopant for the doped semiconductor layer is selected from a p-type dopant and an n-type dopant. An ultraviolet-assisted low temperature (UVLT) anneal of the doped semiconductor layer is performed in an ambient. The ambient is selected from an oxidizing ambient and a nitriding ambient. The oxidizing ambient is used for the n-type dopant. The nitriding ambient is used for the p-type dopant. A sacrificial layer is formed by the doped semiconductor layer during the UVLT anneal. The dopant is driven into the portion of the semiconductor underlayer from the doped semiconductor layer by the UVLT anneal, thereby forming a doped semiconductor underlayer. The sacrificial layer is then removed.

24 Claims, 10 Drawing Sheets

(51) Int. Cl.
| | |
|---|---|
| H01L 29/08 | (2006.01) |
| H01L 29/167 | (2006.01) |
| H01L 21/225 | (2006.01) |
| H01L 21/268 | (2006.01) |
| H01L 21/324 | (2006.01) |
| H01L 21/02 | (2006.01) |
| H01L 29/78 | (2006.01) |
| H01L 29/66 | (2006.01) |

(52) U.S. Cl.
CPC ........ *H01L 21/2686* (2013.01); *H01L 21/324* (2013.01); *H01L 21/823821* (2013.01); *H01L 27/0924* (2013.01); *H01L 29/0847* (2013.01); *H01L 29/167* (2013.01); *H01L 29/7839* (2013.01); *H01L 29/66545* (2013.01)

(58) Field of Classification Search
CPC ......... H01L 21/823821; H01L 27/0924; H01L 29/0847; H01L 29/167; H01L 29/7839; H01L 29/66545
See application file for complete search history.

(56) References Cited

U.S. PATENT DOCUMENTS

| | | | |
|---|---|---|---|
| 9,496,365 | B2 | 11/2016 | Shimizu |
| 9,607,838 | B1 | 3/2017 | Lin et al. |
| 9,660,082 | B2 | 5/2017 | Chang et al. |
| 2003/0235936 | A1 | 12/2003 | Snyder et al. |
| 2007/0221956 | A1 | 9/2007 | Inaba |
| 2008/0002454 | A1* | 1/2008 | Inoue ................ G11C 7/12 365/104 |
| 2009/0008726 | A1 | 1/2009 | Yamauchi et al. |
| 2011/0027957 | A1* | 2/2011 | Berry ................... H01L 21/223 438/301 |
| 2013/0040447 | A1* | 2/2013 | Swaminathan ....... C23C 16/045 438/558 |
| 2017/0025509 | A1 | 1/2017 | Cheng et al. |
| 2017/0229558 | A1 | 8/2017 | Anderson et al. |
| 2017/0323943 | A1* | 11/2017 | Peng .................. H01L 29/1083 |

OTHER PUBLICATIONS

Bae, "A novel tensile Si (n) arid compressive SiGe (p) dual-channel CMOS FinFET co-integration scheme for 5nrn logic applications and beyond," 2016, p. 28.1.1-28.1.4.
Benoit, "Interest of SiCo low k=4.5 spacer deposited at low temperature (400° C.) in the perspective of 3D VLSI integration," 2015; p. 8.6.1-8.6.4.
Boyd, "Vacuum-Ultra-Violet and Ozone Induced Oxidation of Silicon and Silicon-Germanium," Jpn. J. Appl. Phys., vol. 32, No. Part 1, No. 123, pp, 6141-6146, Dec. 1993.
Breil et al., "Highly-Selective Superconformal CVD Ti Silicide Process Enabling Area-Enhanced Contacts for Next-Generation CMOS Architectures," 2017 VLSI, T16.3.
Chiarella, "Towards high performance sub-10nm final bulk FinFET technology," 2016, pp. 131-134.
Craciun, "UV-assisted oxidation of SiGe strained layers," Thin Solid Films, vol. 222, No. 1-2, pp. 145-149, Dec. 1992.
Dorf, "Electron Beam Plasma Tool for Atomic Precision Etching," AVS 61.
Eneman; "Stress simulations for optimal mobility group IV p- and nMOS FinFETs for the 14 nm node and beyond," 2012, p. 6.5.1-6.5.4.
Ho, "Controlled nanoscale doping of semiconductors via molecular monolayers," Nat. Mater., vol. 7, No. 1, pp. 62-67, Jan. 2008.
Ichino, "Sb Pile-up at Oxide/Si Interface during Drive-in Diffusion after Predeposition Using Doped Oxide Source," Jpn. J. Appl. Phys., vol. 42, No. Part 1, No. 3, pp. 1139-1144, Mar. 2003.
Ishii, "Atomic layer etching of silicon nitride using cyclic process with hydrofluorocarbon chemistry," Jpn. J. Appl. Phys., vol. 56, No. 6S2, p. 06H307, Jun. 2017.
Ishikawa, "Enhanced nitridation of silicon at low temperature by ultraviolet irradiation," Electron. Commun. Jpn. Part II Electron., vol. 79, No. 2, pp. 78-85, 1996.
Jacob, "Scaling Challenges for Advanced CMOS Devices," in Selected Topics in Electronics and Systems, vol. 59, World Scientific, 2017, pp. 1-76.
Jeong, "Thermodynamic Study on the Formation of Boron Nitride," J. Nanosci. Nanotechnol., vol. 13, No. 11, pp. 7766-7769, Nov. 2013.
Jones, "Diffusion in Silicon," p. 41-44, 2008.
Kaler, "Atomic layer etching of silicon dioxide using alternating C4F8 and energetic Ar plasma beams," J. Phys. Appl. Phys., vol. 50, No. 23, p. 234001, Jun. 2017.
Kim, "Stability and Segregation of B and P Dopants in Si/SiO 2 Core-Shell Nanowires," Nano Lett., vol. 12, No. 10, pp. 5068-5073, Oct. 2012.
Kuhn, "CMOS scaling beyond 32nm: challenges and opportunities," 2009, p. 310.
Larson, "Overview and status of metal S/D Schottky-barrier MOSFET technology," IEEE Trans. Electron Devices, vol. 53, No. 5, pp. 1048-1058, May 2006.
Lee, "Low-Temperature Microwave Annealing Processes for Future IC Fabrication, 2014; A Review," IEEE Trans. Electron Devices, vol. 61, No. 3, pp. 651-665, Mar. 2014.
Li, "Fluorocarbon based atomic layer etching of Si3N4 and etching selectivity of SiO2 over Si 3N4," J. Vac, Sci, Technol. Vac. Surf. Films, vol. 34, No. 4, p. 41307, Jul. 2016.
Liu et al. of T16.1 VLSI 2017, Dual Beam Laser Annealing for Contact Resistance Reduction and Its Impact on VLSI Integrated Circuit Variability.
Moulson, "Reaction-bonded silicon nitride: its formation and properties," J. Mater. Sci., vol. 14, No. 5, pp. 1017-1051, May 1979.
Müller, Deactivation and activation of donors in silicon, 2004, p. 139.
Narasimha, "22nm High-performance SOI technology featuring dual-embedded stressors, Epi-Plate High-K deep-trench embedded DRAM and self-aligned Via 15LM BEOL," 2012, p. 3.3.1-3.3.4.
Natarajan, "A 14nm logic technology featuring 2nd-generation FinFET, air-gapped interconnects, self-aligned double patterning and a 0.0588 um2 SRAM cell size," 2014, p. 3.7.1-3.7.3.
Paul, "Si/SiGe heterostructures: from material and physics to devices and circuits," Semicond. Sci. Technol., vol. 19, No. 10, pp. R75-R108, Oct. 2004.
Qiu, "A Comparative Study of Two Different Schemes to Doparit Segregation at NiSi/Si arid PtSi/Si Interfaces for Schottky Barrier Height Lowering," IEEE Trans. Electron Devices, vol. 55, No. 1, pp. 396-403, Jan. 2008.
Sakamoto, "Segregation and transport coefficients of impurities at the Si/SiO2 interface," J. Appl. Phys., vol. 61, No. 4, p. 1553, 1987.
Seo, "Selective wet etching of Si3N4/SiO2 in phosphoric acid with the addition of fluoride and silicic compounds," Microeiectron. Eng., vol. 118, pp. 66-71, Apr. 2014.
Sherpa, "Quasi-atomic layer etching of silicon nitride," J. Vac. Sci. Technol. Vac. Surf. Films, vol. 35, No. 1, p. 01A102, Jan. 2017.
Steen, "Distribution and segregation of arsenic at the SiO[sub 2]/Si interface," J. Appl. Phys., vol. 104, No. 2, p. 23518, 2008.
Xie, "A 7nm FinFET technology featuring EUV patterning and dual strained high mobility channels," 2016, p. 2.7.1-2.7.4.
Zhu, "Subcircuit Compact Model for Dopant-Segregated Schottky Gate-All-Around Si-Nanowire MOSFETs," IEEE Trans. Electron Devices, vol. 57, No. 4, pp. 772-781, Apr. 2010.

\* cited by examiner

US 10,586,738 B2

METHOD OF PROVIDING SOURCE AND DRAIN DOPING FOR CMOS ARCHITECTURE INCLUDING FINFET AND SEMICONDUCTOR DEVICES SO FORMED

CROSS-REFERENCE TO RELATED APPLICATIONS

This application claims the benefit of provisional Patent Application Ser. No. 62/577,555, filed Oct. 26, 2017, entitled "METHOD OF SOURCE AND DRAIN DOPING FOR CMOS ARCHITECTURE INCLUDING finFET", assigned to the assignee of the present application, and incorporated herein by reference.

BACKGROUND

The trend in CMOS devices is toward decreased size. However, scaling down in size generally degrades device performance. For example, planar CMOS device performance deteriorates when it is scaled down to the 32/20 nm node. Consequently, fin field effect transistors (finFETs) have been developed. FinFETs may have better electrostatic or short channel effect (SCE) control than planar CMOS devices at the 22/14 nm node. FinFET devices are thus replacing planar CMOS devices at smaller scales.

Various technologies that have improved the performance of planar CMOS devices are desired to be extended to finFET devices to improve finFET device operation. One such technology is embedded source/drain (eSD) technology. The eSD technology provides a desired channel strain when suitable epitaxial materials, such as doped eSiGe for pFETs or doped eSi:C for nFETs, are grown adjacent to the channel. Such changes improve performance in planar CMOS devices. However, the change in architecture from a planar to a fin structure may diminish the benefits achieved from technologies such as eSD. Issues from scaling down, such as source-drain merging with neighboring devices and the volume reduction of the source and drain, may also negatively impact performance.

An alternative approach, raised source-drain (rSD), grows the source/drain regions around the un-recessed silicon fin adjacent to the spacer in a cladding-like manner. Consequently, this approach is also termed cladding source-drain (cSD) herein. This growth is followed by a high temperature anneal(s) to drive the dopants into the undoped fin. The anneal temperatures for such high-temperature anneals are in excess of one thousand degrees Celsius. Although rSD may have advantages, there are still issues to be resolved. For example, simultaneously achieving the high doping concentration of the S/D and the high junction steepness has proven challenging because of the high temperature anneal and the lack of a snow plow effect. In order to drive the dopants, native oxides on the interface are removed to preclude the use of even higher temperature anneals. The junction resistance may also be undesirably increased because of dilution of the dopants. The junction steepness may also be reduced. The high thermal stress due to the anneal may also negatively impact wafer integrity and overall CMOS manufacturability.

Other approaches to improving performance exhibit similar issues in obtaining the desired structures for finFET technology. For example, silicidation approaches deposit a highly doped Si layer on the exposed, undoped fin. A metal layer such as Ti is deposited on the highly doped Si layer. A thermal anneal step is performed to silicide the deposited silicon layer to drive the dopants into the undoped fin. However, the solubilities of dopants in the silicides are relatively high. As a result, the snow plow effect is inefficient. Further, the silicidation continues to consume the semiconductor materials beneath (Si, Ge, etc.) during the subsequent dopant activation anneal. This may complicate the overall source-drain integration.

Thus, various issues exist in attempts to improve the performance of semiconductor devices. However, because of the desire to increase scaling to smaller nodes and improve performance, research in finFET devices ongoing.

BRIEF SUMMARY OF THE INVENTION

A method for providing a semiconductor device and the device so formed are described. A doped semiconductor layer is deposited on a semiconductor underlayer. At least a portion of the semiconductor underlayer is exposed. A dopant for the doped semiconductor layer is selected from a p-type dopant and an n-type dopant. An ultraviolet-assisted low temperature (UVLT) anneal of the doped semiconductor layer is performed in an ambient. The ambient is selected from an oxidizing ambient and a nitriding ambient. The oxidizing ambient may be used for the n-type dopant. The nitriding ambient may be used for the p-type dopant. A sacrificial layer is formed by the doped semiconductor layer during the UVLT anneal. The sacrificial layer may be a nitride layer for a nitriding ambient or an oxide layer for an oxidizing ambient. The dopant is driven into the portion of the semiconductor underlayer from the doped semiconductor layer by the UVLT anneal, thereby forming doped regions in a doped semiconductor underlayer. The sacrificial layer is then removed.

The method described herein drives the dopant into the semiconductor underlayer, such as an un-doped, un-recessed silicon fin. As a result, a high doping concentration and high junction steepness may be achieved. A highly doped source/drain may then be epitaxially grown on the doped fin if desired. Alternatively, a metal contact can be formed around the doped fin after the sacrificial layer is removed. Thus, a very high doping concentration and very steep junction transitions for semiconductor devices such as CMOS can be realized.

DETAILED DESCRIPTION OF THE INVENTION

Figure 1:
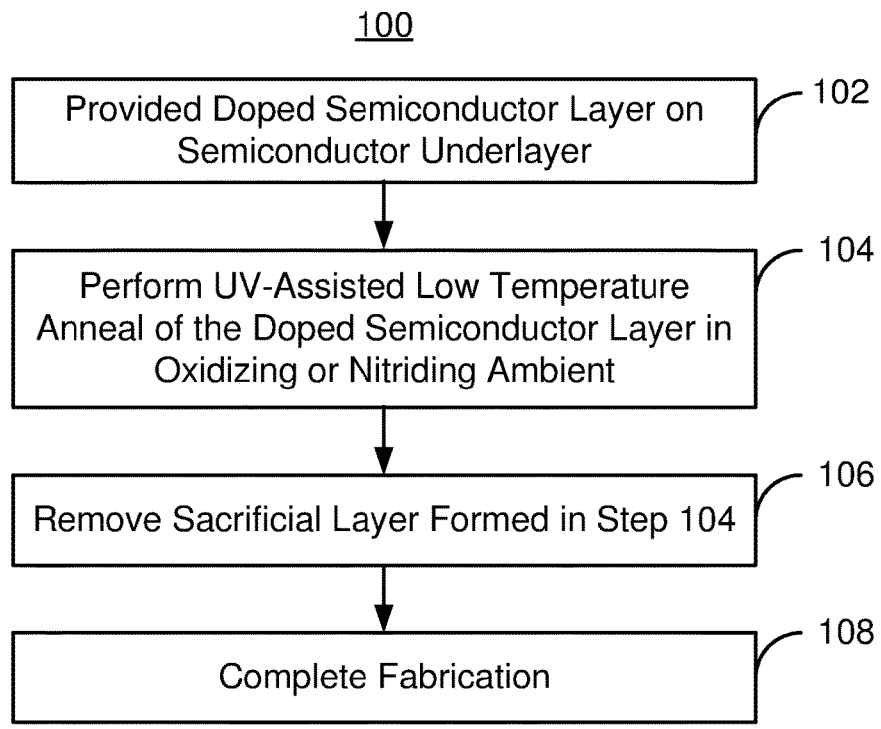
FIG. 1 is a flow chart depicting an exemplary embodiment of a method for providing a highly doped semiconductor device.

The exemplary embodiments relate to semiconductor devices including CMOS devices such as finFETs, eSD devices, rSD devices and Schottky barrier (SB) CMOS devices. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations.

Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or fewer components than those shown, and variations in the arrangement and type of the components may be made without departing from the scope of the invention. The exemplary embodiments will also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

A method for providing a semiconductor device and the device so formed are described. A doped semiconductor layer is deposited on a semiconductor underlayer. At least a portion of the semiconductor underlayer is exposed. A dopant for the doped semiconductor layer is selected from a p-type dopant and an n-type dopant. An ultraviolet-assisted low temperature (UVLT) anneal of the doped semiconductor layer is performed in an ambient. The ambient is selected from an oxidizing ambient and a nitriding ambient. The oxidizing ambient is used for the n-type dopant. The nitriding ambient is used for the p-type dopant. A sacrificial layer is formed by the doped semiconductor layer during the UVLT anneal. The sacrificial layer may be a nitride layer for a nitriding ambient or an oxide layer for an oxidizing ambient. The dopant is driven into the portion of the semiconductor underlayer from the doped semiconductor layer by the UVLT anneal, thereby forming a doped semiconductor underlayer. The sacrificial layer is then removed.

Figure 2A:
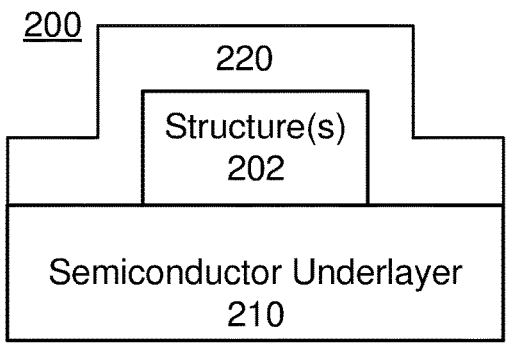
FIGS. 2A-2C depict portions of an exemplary embodiment of a semiconductor device, such as a CMOS device, during fabrication.
Figure 2B:
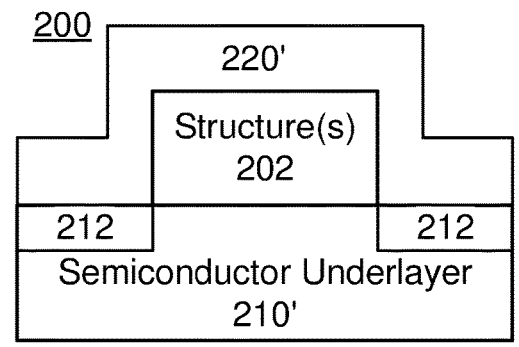
Figure 2C:
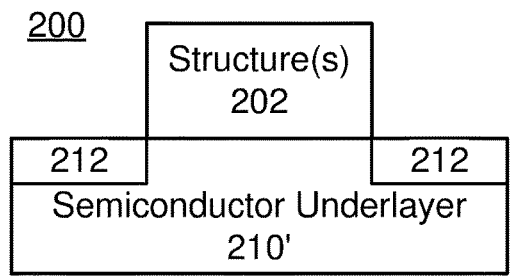

FIG. 1 is a flow chart depicting an exemplary embodiment of a method for providing a highly doped semiconductor device. For simplicity, some steps may be omitted, performed in another order and/or combined. Further, the method 100 may start after other steps in forming the semiconductor device have been performed. FIGS. 2A-2C depict portions of an exemplary embodiment of a semiconductor device 200, such as a CMOS device, during fabrication using the method 100. For simplicity, not all components are shown in FIGS. 2A-2C and FIGS. 2A-2C are not to scale. Consequently, the method 100 is described in the context of the semiconductor device 200.

The method 100 starts after a semiconductor underlayer has been provided. For example, the semiconductor underlayer might be a fin for a finFET device, or may be another semiconductor layer or portion of a CMOS device. The semiconductor underlayer is termed an underlayer merely because it resides under other layers described for the method 100. The semiconductor underlayer need not be recessed or lie within part of the wafer. Various structures may also have been provided on the semiconductor underlayer. For example, masks, dummy structures, spacers or other layers used to control the placement of dopant may have been formed. A portion of the semiconductor underlayer into which dopants are desired to be driven are exposed at the start of the method 100. In some embodiments, the semiconductor underlayer is undoped. However, in other embodiments, the semiconductor underlayer may be doped.

A doped semiconductor layer is provided on the semiconductor underlayer, via step 102. The semiconductor layer is generally desired to be highly doped. The dopant(s) in the doped semiconductor layer are selected based upon the dopant(s) desired to be driven into the semiconductor underlayer. For example, the dopant(s) may be p-type, such as B, if a p-FET is to be formed. Alternatively, the dopant(s) may be n-type if an n-FET is to be formed. Examples of n-type dopants include P, As and Sb. FIG. 2A depicts the semiconductor device 200 after step 102 is performed. The semiconductor underlayer 210 and structure(s) 202 formed previously are shown. The semiconductor underlayer 210 may be a Si fin and the structure(s) 202 may include a dummy gate and spacers in some embodiments. Also depicted is doped semiconductor layer 220. In some embodiments, the semiconductor underlayer 210 is undoped Si, while the doped semiconductor layer 220 is doped Si.

An ultraviolet-assisted low temperature (UVLT) anneal of the doped semiconductor layer 220 is performed in an ambient, via step 104. Because the anneal is assisted by ultraviolet light, a lower anneal temperature may be used. The low anneal temperature is less than one thousand degrees Celsius. For example, the anneal temperature may be at least four hundred degrees Celsius and not more than seven hundred degrees Celsius. In some embodiments, the anneal temperature is at least five hundred degrees Celsius. The maximum anneal temperature may be six hundred degrees Celsius. Such lower anneal temperatures are still capable of driving the dopant(s) in the doped semiconductor layer 220 because of the assistance provided by the ultraviolet light.

The ambient selected for use in step 104 depends upon the dopant in the doped semiconductor layer. In general, the ambient selected is such that the dopant has a low diffusivity and solubility in a material formed by the semiconductor layer 220 reacting with the ambient. For example, an n-type dopant such as P, As or Sb, the ambient is oxidizing ambient. For a p-type dopant such as B, the ambient is a nitriding ambient. As a result, some or all of the doped semiconductor layer 220 may be converted to a sacrificial oxide layer or a sacrificial nitride layer in step 104. In some such embodiments, all of the semiconductor layer 220 is consumed in step 104. Thus, the semiconductor layer may be completely converted to the oxide layer or nitride layer.

The combination of the UVLT anneal and the ambient selected result in an effect analogous to the snow plow effect to drive the dopant(s) in the doped semiconductor layer 220 into the semiconductor underlayer 210. For an oxide of the semiconductor layer such as Si, the n-type dopants (e.g. P, As, Sb) generally have limited solubility. Consequently, these n-type dopants pile up at the oxidation front. Oxidation of the (n-type) doped semiconductor layer thus drives the n-type dopant(s) deeper into the doped semiconductor layer 220 and, eventually, into the semiconductor underlayer 210. For other n-type dopants and/or other semiconductors, other ambients including but not limited to a nitriding ambient may be used to provide an analogous effect. Similarly, p-type dopants such as B have limited solubility and diffusivity in nitrides of Si. These p-type dopants may segregate at the nitride front in a manner analogous to the snow plow effect. Nitridation of the (p-type) doped semiconductor layer drives the p-type dopant(s) deeper into the doped semiconductor layer 220 and then into the semiconductor underlayer 210. For other p-type dopants and/or other semiconductors, another ambient may be used to obtain an analogous effect. Thus, the low temperature anneal in combination with the oxidation or nitridation drives the dopant(s) into the semiconductor underlayer 210. Step 104 may thus be considered to carry out a low temperature snow plow effect on n-type dopant(s) or p-type dopant(s). Consequently, the semiconductor underlayer 210 may be doped.

FIG. 2B depicts the semiconductor device 200 after step 104 is performed. Thus, the doped semiconductor layer 220 has reacted with the ambient to become a sacrificial layer 220'. In the embodiment shown, the doped semiconductor layer 220 has been completely consumed. In other embodiments, the doped semiconductor layer 220 might not be completely consumed. Thus, a sacrificial layer 220' and a remaining portion of the semiconductor layer (not shown) might be present. The sacrificial layer 220' may be an oxide or nitride of the semiconductor and can be removed later. The semiconductor underlayer 210' has doped regions 212 that include the dopant(s) driven in from the doped semiconductor layer 220 by the UVLT anneal. The doped regions 212 may be highly doped. For example, the concentration of the doped regions may be $10^{19}/cm^3$-$10^{22}/cm^3$. In some such embodiments, the dopant concentration may be $10^{20}/cm^3$-$10^{21}/cm^3$. In alternate embodiments, other concentrations are possible. Further, the doped regions 212 have a sharp transition because of the low temperatures used for the anneal. For example, in some embodiments, the transition may be on the order of 2 nm/decade or sharper. Other transitions may also be possible in alternate embodiments.

The sacrificial layer 220' is removed, via step 106. The appropriate removal chemistry for an oxide or nitride may be used in step 106. Further, the removal process should have a high selectivity for the underlying doped semiconductor underlayer 210'. For example, a wet HF solution or an atomic layer etch (ALE) may be used for an oxide sacrificial layer 220'. Similarly, an ALE removal process may be used for a nitride sacrificial layer 220'.

FIG. 2C depicts the semiconductor device 200 after step 106 is performed. Thus, the sacrificial layer 220' has been removed. The semiconductor underlayer 210' with highly doped junctions 212 and previously-formed structure(s) 202 remain.

Fabrication of the semiconductor device may then be completed, via step 108. For example, if the doped semiconductor underlayer 210' is a Si fin, then the regions 212 may form the source and drain. A metal wraparound contacts may then be provided on the regions 212. Alternatively, rSD technology may be used to form a highly doped source and drain. If the doped semiconductor underlayer 210' forms part of a silicon channel exposed after the source and drain are etched away, the doped regions 212 may form steep junctions for a SB-CMOS device. A metal source and drain may also be formed after removal of the sacrificial layer 220'. Other devices may also be formed from the doped semiconductor layer 210' including highly doped, sharp transition regions 212.

The method 100 drives dopant into the semiconductor underlayer 210, such as an un-doped, un-recessed silicon fin or channel region of an SB-CMOS device. As a result, high doping concentration junctions 212 may be achieved. Because low temperatures are used, the dopants are less likely to diffuse. This may allow high junction steepness to be achieved. The high dopant concentration and junction steepness may be provided for devices used at scaled down nodes, such as the 22/14 nm node. Further, the sacrificial layer 220' may be relatively easily removed, leaving the fin, channel or other structure with doped regions 212. Fabrication of the desired device may then be completed. Thus, a very high doping concentration and very steep junction transitions for semiconductor devices such as CMOS finFETs at very can be obtained at very low characteristic distances. Performance of devices that have been scaled up may, therefore, be enhanced.

Figure 3:
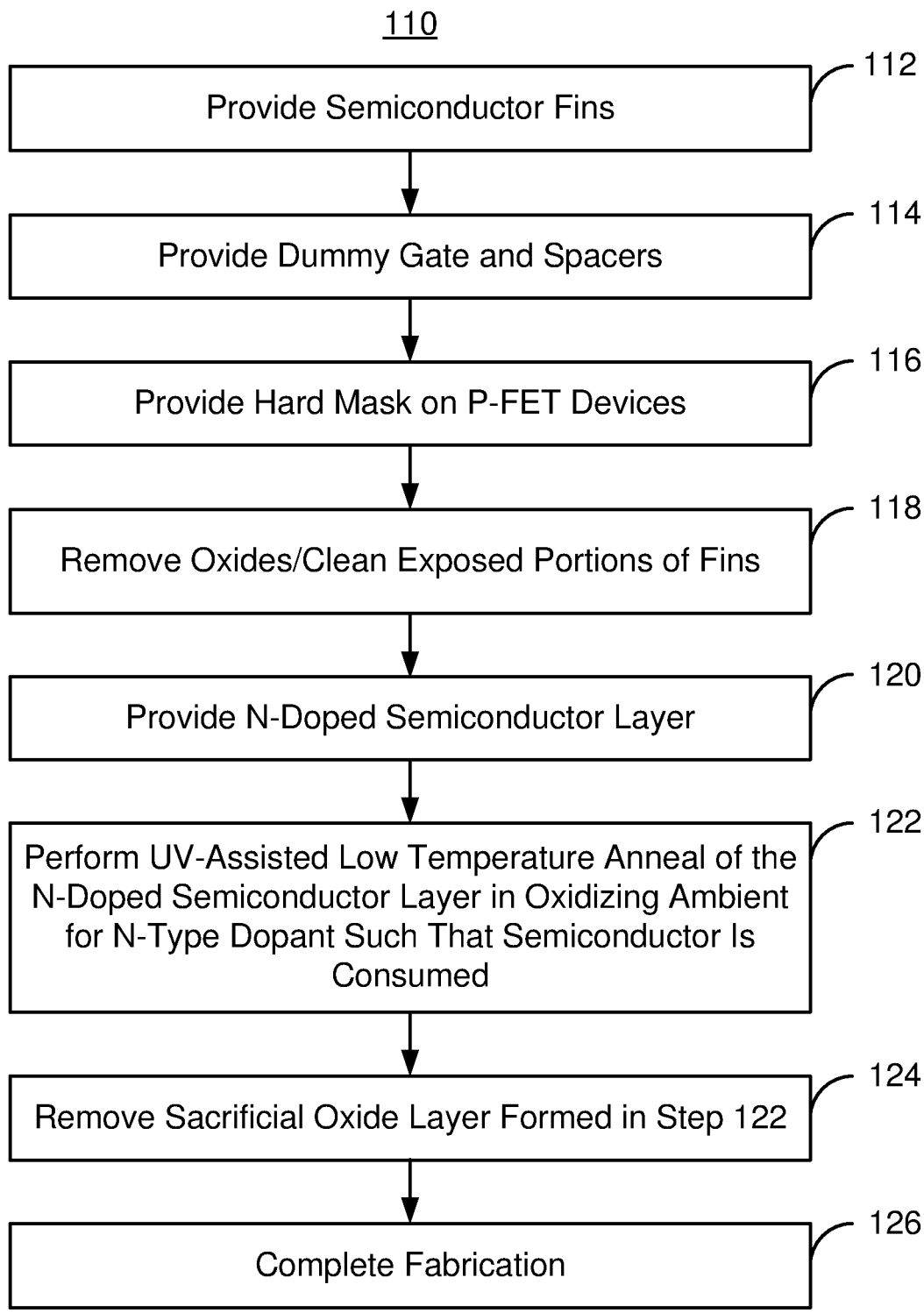
FIG. 3 is a flow chart depicting an exemplary embodiment of a method for providing highly doped n-doped finFETs.

FIG. 3 is a flow chart depicting an exemplary embodiment of a method 110 for providing a highly n-doped n-FET. For simplicity, some steps may be omitted, performed in another order and/or combined. Further, the method 110 may start after other steps in forming the semiconductor device have been performed. FIGS. 4A-4D depict portions of an exemplary embodiment of a CMOS n-FET device 250 during fabrication using the method 110. For simplicity, not all components are shown in FIGS. 4A-4D. FIGS. 4A-4D are not to scale. Consequently, the method 110 is described in the context of the semiconductor device 250. The method 110 may start after a number of other steps have been performed in fabricating the nMOS device 250.

The semiconductor fins are provided for the CMOS device 250, via step 112. In addition, a dummy gate and spacers are also provided, via step 114. Steps 112 and 114 may be performed in a conventional manner. Typically, the semiconductor fins provided are formed of undoped silicon. For an n-FET, the spacers provided are typically silicon nitride or SiCO.

A hard mask is provided, via step 116. The hard mask covers the regions in which p-FET devices are formed, but exposes the regions in which n-FET devices are formed. The hard mask provided in step 116 is desired to not only protect the p-FET devices from the processes carried out for formation of the doped regions, described below, but also be selectively removable from the silicon fin/channel and spacers. One of the processes to be carried out below is a UVLT anneal in an ambient such as an oxidizing or nitriding ambient. The hard mask may be desired to be highly resistant to oxidation. In other embodiments, the hard mask may be desired to be highly resistant to nitridation. Moreover, the selectivity for removal between the hard mask and the Si fins and spacers is desired to be high. The hard mask is also desired to be highly conformal and thin. For example, on the hard mask may be the order of at least one or two nanometers and not more than ten nanometers thick. In some embodiments, the hard mask is desired to be not more than five nanometers thick.

In order for the hard mask to be removed from the Si fins and spacers, the hard mask should exhibit a high selectivity for removal over the fin and spacer material(s) for the desired removal processes. For example, a hard mask such as SiCO, $Al_2O_3$, $TiO_2$, $SiO_2$, TiN, TaN or like materials may be used if a silicon nitride spacer is used. Such hard masks may be removed via a wet HF solution or atomic layer etch with high selectivity with respect to a silicon nitride spacer. A hard mask such as $SiO_2$, $Si_3N_4$, $Al_2O_3$, $TiO_2$, TiN or like materials may be used if a SiCO spacer is used. SiCO does not react with HF solutions, while such hard mask materials are removable using a wet HF etch. For example, an extremely high selectivity of $Si_3N_4$ over $SiO_2$ may be achieved by modifying phosphoric acid with the addition of fluoride and silicic compounds. A hot $H_2O_2$ solution may remove $TiO_2$ with an ALD-$Al_2O_3$ hard mask. Thus, the hard mask may be removable in the desired manner via a wet etch. There is a high selectivity for removing $SiO_2$ over $Si_3N_4$ via ALE using an optimized fluorocarbon plasma. $SiO_2$ can be removed in a very precise and self-limiting fashion against nitride and silicon using an alternating $C_4F_4$ and argon plasma in ALE. A high selectivity of $Si_3N_4$ over $SiO_2$ may be achieved in ALE by adding an additional hydrogen plasma step to an FC chemistry. A very high selectivity for $Si_3N_4$ over $SiO_2$ and poly-silicon can be achieved by optimizing the fluorocarbon based chemistries with an electron beam-generated low electron temperature plasma via ALE. In some embodiments, therefore, the hard mask may be removable via ALE. Thus, by proper selection of the hard mask materials and etch chemistries, a hard mask that protects the p-FET device regions from processes such as a UVLT anneal in the desired ambient, that is thin and that can be selectively removed from the fin and spacers may be provided in step 116.

A cleaning process is performed to remove oxides on the surface of the Si fins for the n-FET devices, via step 118. For example, an ex-situ HF dip and an in-situ SiCoNi (from AMAT) or chemical oxide removal (COR) may be applied. The processes are configured to remove very thin (e.g. less than one nanometer thick) native oxides from the regions of the fin at which the n-type source and drain may be formed.

Figure 4A:
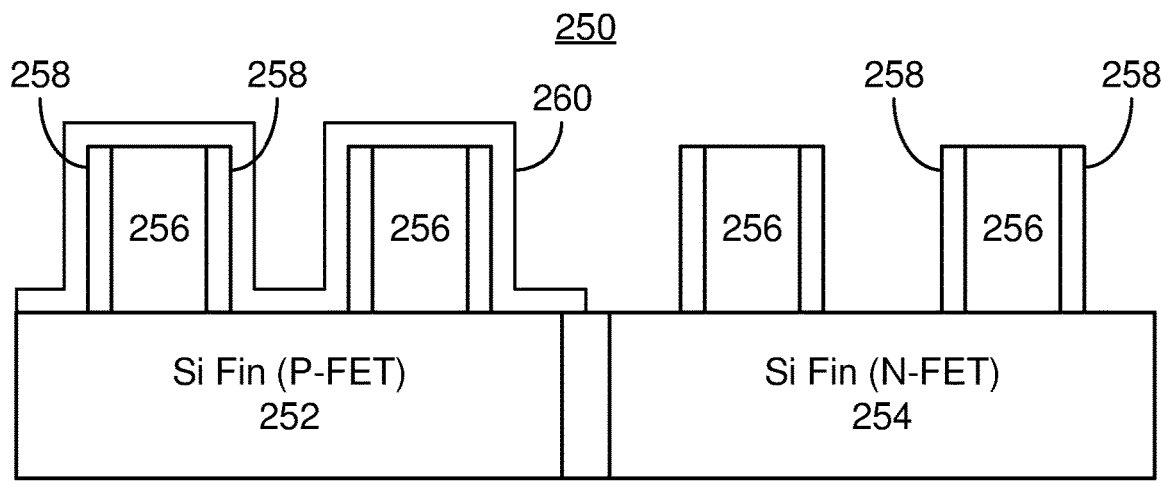
FIGS. 4A-4D depict portions of an exemplary embodiment of a CMOS device during fabrication.

FIG. 4A depicts the CMOS device 250 after step 118 is performed. The fins 252 for the p-FET devices as well as the fins 254 for the n-FET devices have been formed. The fins 252 and 254 are undoped Si in the embodiment shown. Also shown are dummy gates 256 and spacers 258. For clarity, only some of the spacers 258 are labeled. Hard mask 260 has also been provided on the fin 252 for the p-FET devices. As discussed above, the material(s) selected for the hard mask 260 depend upon the materials used for the spacers 258. Thus, the hard mask 260 may be removable from the Si fin 252 and spacers 258 but protects the fin 252 from the UVLT anneal described below. In addition, step 118 has removed any native oxides from the exposed regions of the fin 254 adjacent to the spacers 258. These structures may be formed on a wafer (not explicitly shown). The wafer may include but is not limited to silicon, a silicon-comprising material (e.g. including Si or SiGe) on SRB (strain relieved SiGe buffer), SOI (silicon on insulator), strained SOI (sSOI), or strained SiGeOI (sSiGeOI) with various orientations including but not limited (100) and (110). The Si fin 254 corresponds to the semiconductor underlayer 252 of FIGS. 2A-2C and the method 100.

Figure 4B:
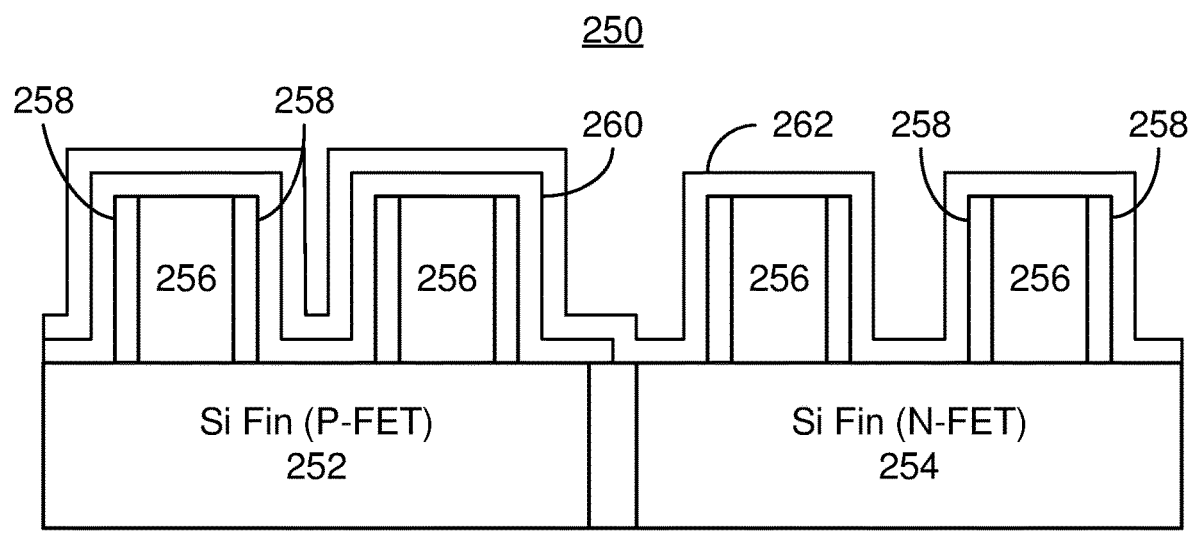

A highly n-doped Si layer is deposited on the device 250, via step 120. The silicon layer may be amorphous silicon and/or polysilicon in some embodiments. The n-type dopant may be P, As, Sb and/or another n-type dopant. FIG. 4B depicts the CMOS device 250 after step 120 is performed. Thus, an n-doped Si layer 262 has been deposited on both the n-FET fin 254 and the P-FET fin 252. However, the n-doped Si layer 262 does not contact the Si fin 252 because of the hard mask 260. In some embodiments, the n-doped Si layer 262 has at thickness of at least one nanometers and not more than ten nanometers. For example, the thickness may be nominally three nanometers through ten nanometers. In some embodiments, the thickness of the n-doped Si layer 262 is at least one nanometers and not more than five nanometers thick. The n-doped Si layer 262 corresponds to the doped semiconductor layer 220 of FIGS. 2A-2C and the method 100.

A UVLT anneal of the n-doped Si layer 262 is performed in an ambient that can drive the n-type dopant into the Si fin 254, via step 122. Because the anneal is assisted by ultraviolet light, a lower anneal temperature may be used. The low anneal temperature may be at least four hundred degrees Celsius and not more than seven hundred degrees Celsius. In some embodiments, the anneal temperature is at least five hundred degrees Celsius. The maximum anneal temperature may be six hundred degrees Celsius in some embodiments. Such lower anneal temperatures are still capable of driving the dopant(s) in the n-doped Si layer 262 with the assistance provided by the ultraviolet light.

The n-doped Si layer is desired to be oxidized in the method 110. Consequently, an oxidizing ambient is used in step 122. For example, steam or ozone, with or without UV-assist may be used in the UVLT anneal. As a result, some or all of the n-doped Si layer 262 may be converted to a sacrificial oxide layer in step 122. A noble gas, such as argon, may also be flowed near the end of the UVLT anneal to ensure that the silicon in the n-doped Si layer 262 is consumed. In some such embodiments, all of the n-doped Si layer 262 is consumed in step 122. Thus, the n-doped Si layer 262 may be completely converted to the oxide layer. In addition, the UVLT in the oxidizing ambient effectively uses the snow plow effect to drive the n-type dopant(s) from the n-doped Si layer 262 into the Si fin 254. Consequently, the Si fin 254 may be doped.

Figure 4C:
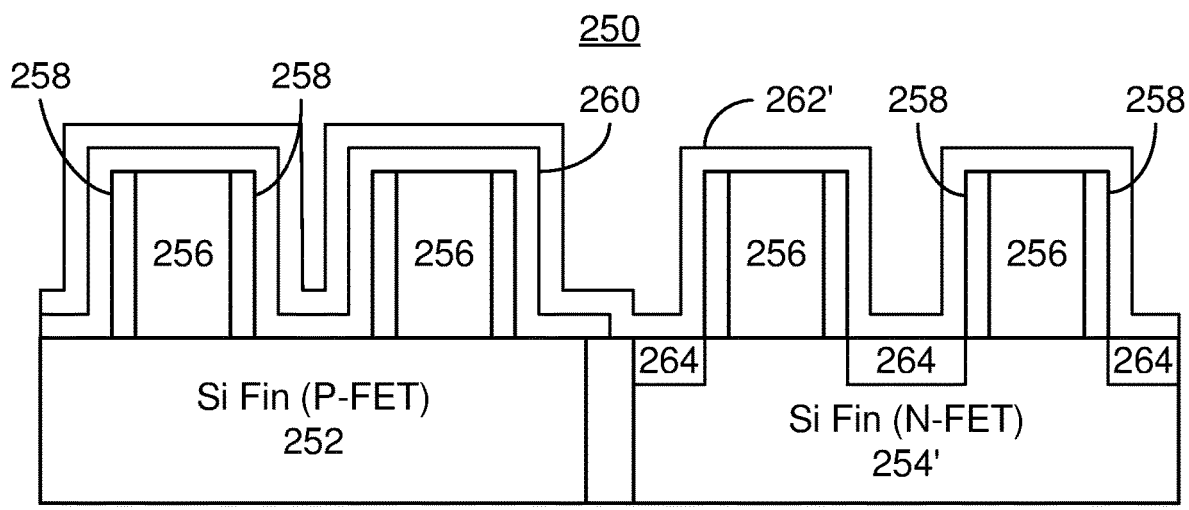

FIG. 4C depicts the CMOS device 250 after step 122 is performed. Thus, the n-doped Si layer 262 has reacted with the ambient to become a sacrificial oxide layer 262'. In the embodiment shown, the n-doped Si layer 262 has been completely consumed. Thus, it has been replaced in FIG. 4C by sacrificial oxide layer 262'. The Si fin 254' has n-doped regions 264 that include the n-type dopant(s) driven in from the n-doped Si layer 262 by the UVLT anneal. The doped regions 264 may be highly doped and have a sharp transition. For example, the concentration of the doped regions 264 may be $10^{19}/cm^3$-$10^{22}/cm^3$. In some such embodiments, the dopant concentration may be $10^{20}/cm^3$-$10^{21}/cm^3$. Other concentrations are possible. In some embodiments, the transitions for the doped regions 264 may be on the order of 2 nm/decade or sharper. Other transitions may also be possible in alternate embodiments.

Figure 4D:
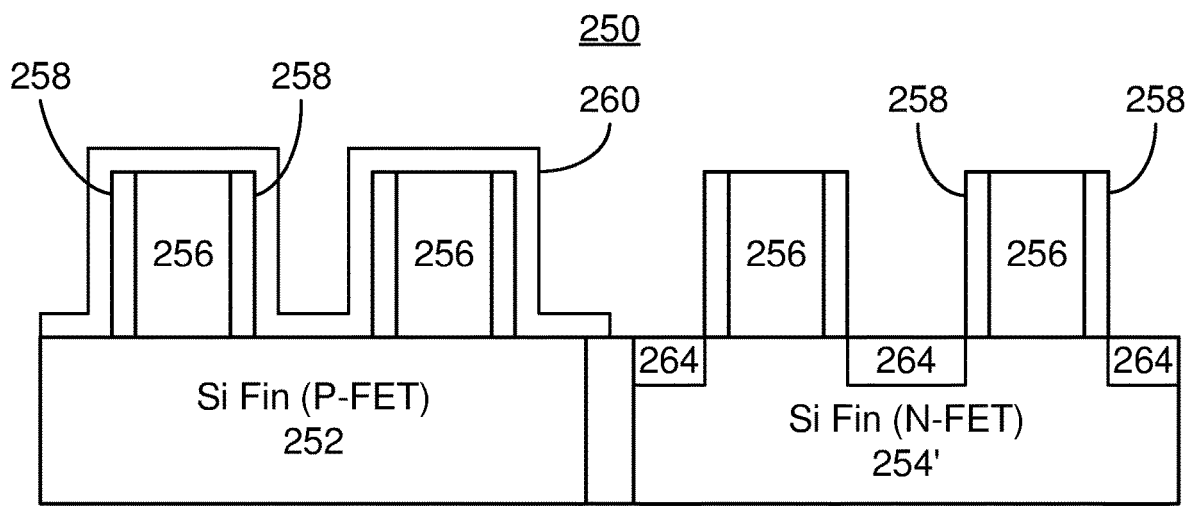

The sacrificial oxide layer 262' is removed, via step 124. The appropriate removal chemistry and process for an oxide may be used in step 124. Further, the removal process has a high selectivity with respect to the underlying doped Si fin 254 and spacers 258. For example, ALE may be used to remove the oxide sacrificial layer 262' without damaging the underlying structures 254' and 258. FIG. 4D depicts the CMOS device 250 after step 124 is performed. Thus, the sacrificial oxide layer 262' has been removed. The Si fin 254' with highly doped, sharp transition junctions 264, spacers 258 and dummy gates 256 remain.

Fabrication of the CMOS device may then be completed, via step 126. For example, a metal wraparound contacts may then be provided on the regions 264. In some embodiments, the metal contact may be formed of material(s) such as Ti, W, Co, or Cu and may be at least three nanometers and not more than ten nanometers thick. Alternatively, rSD technology may be used to form a highly doped source and drain. If a SB-CMOS device is to be formed, a metal such as Ti, V, Yb, Er or other metals with a work function close to the conduction band edge may be provided on the doped Si fin 254'. In some embodiments, the metal is at least one nanometer and not more than ten nanometers thick. Subsequent metals, such as W or TiN, may be deposited later to complete the source drain formation of the SB-CMOS device. Other devices may also be formed from the Si fin 254' including highly doped, sharp transition regions 264.

The method 110 drives dopant into the Si fin 254. As a result, a high doping concentration, sharp transition junctions 264 may be formed. The high dopant concentration and junction steepness may be provided for n-type finFET devices used at scaled down nodes. Thus, a very high doping concentration and very steep junction transitions for CMOS devices such as CMOS finFETs at very can be obtained at very low characteristic distances. Performance of devices that have been scaled up may, therefore, be enhanced.

Figure 5:
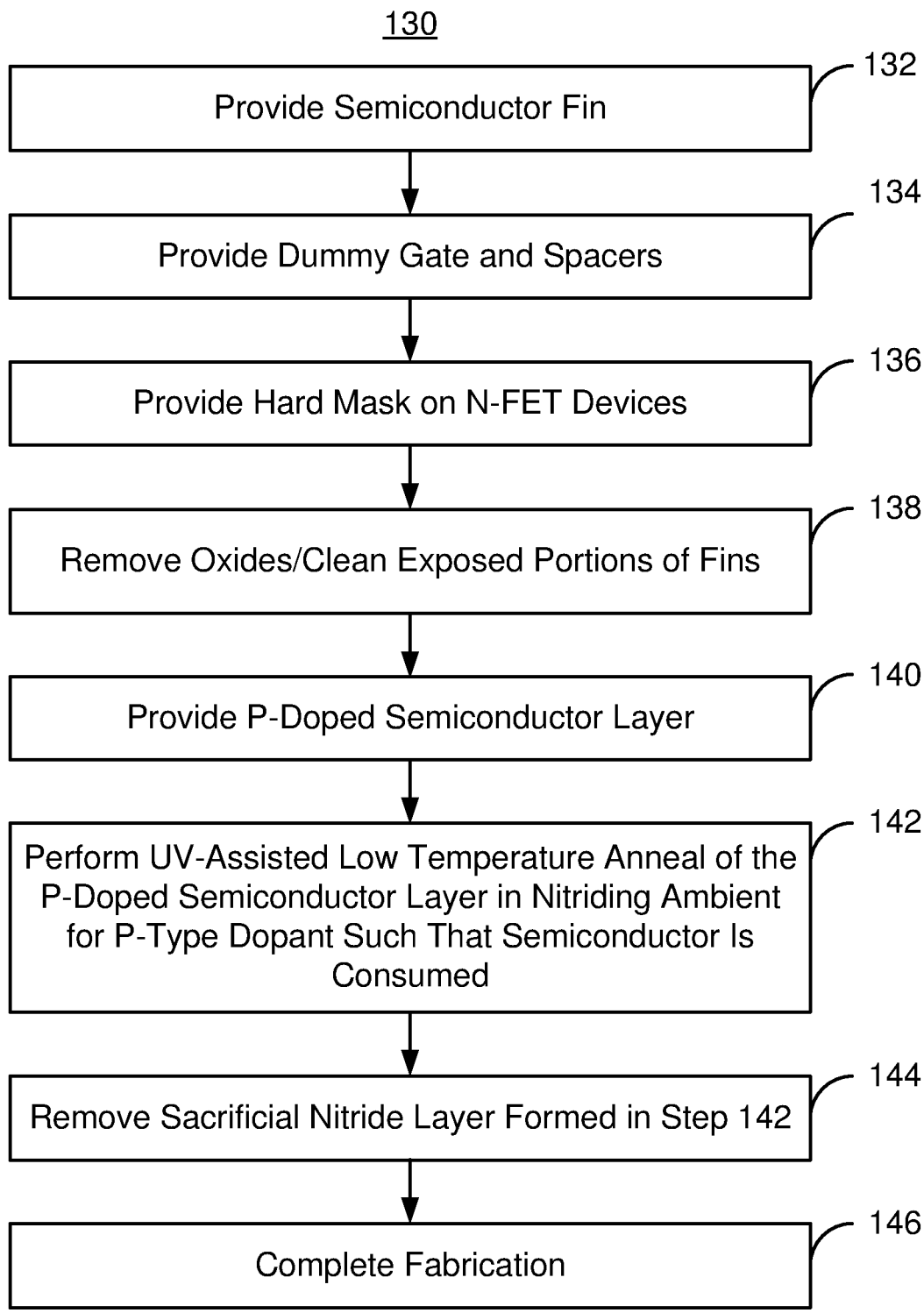
FIG. 5 is a flow chart depicting an exemplary embodiment of a method for providing a highly doped p-doped finFETs.

FIG. 5 is a flow chart depicting an exemplary embodiment of a method 130 for providing a highly p-doped p-FET. For simplicity, some steps may be omitted, performed in another order and/or combined. Further, the method 130 may start after other steps in forming the semiconductor device have been performed. FIGS. 6A-6D depict portions of an exemplary embodiment of a CMOS p-FET device 250A during fabrication using the method 130. For simplicity, not all components are shown in FIGS. 6A-6D. FIGS. 6A-6D are not to scale. Consequently, the method 130 is described in the context of the semiconductor device 250. The method 130 may start after a number of other steps have been performed in fabricating the pMOS device 250A. The CMOS device 250A is analogous to the device 250 depicted in FIGS. 4A-4D. Consequently, analogous components have similar labels.

The semiconductor fins are provided for the CMOS device 250A, via step 132. In addition, a dummy gate and spacers are also provided, via step 134. Steps 132 and 134 may be performed in a conventional manner and are analogous to steps 112 and 114 of the method 110. Typically, the semiconductor fins provided are formed of undoped silicon. For an p-FET, the spacers provided are typically SiCO or silicon nitride.

A hard mask is provided, via step 136. The hard mask covers the regions in which n-FET devices are formed, but exposes the regions in which p-FET devices are formed. The hard mask provided in step 136 is desired to not only protect the n-FET devices from the processes carried out for formation of the doped regions, described below, but also be selectively removable from the silicon fin/channel and spacers. One of the processes to be carried out below is a UVLT anneal in an ambient such as a nitriding ambient. The hard mask may be desired to be highly resistant to nitridation. Moreover, the selectivity for removal between the hard mask and the Si fins and spacers is desired to be high. The hard mask is also desired to be highly conformal and thin. For example, on the hard mask may be the order of at least one or two nanometers and not more than ten nanometers thick. In some embodiments, the hard mask is desired to be not more than five nanometers thick.

In order for the hard mask to be removed from the Si fins and spacers, the hard mask should exhibit a high selectivity for removal over the fin and spacer material(s) for the desired removal processes. For example, a hard mask such as SiCO, $Al_2O_3$, $TiO_2$, $SiO_2$, TiN, TaN or like materials may be used if a silicon nitride spacer is used. Such hard masks may be removed via a wet HF solution or atomic layer etch with high selectivity with respect to a silicon nitride spacer. A hard mask such as $SiO_2$, $Si_3N_4$, $Al_2O_3$, $TiO_2$, TiN or like materials may be used if a SiCO spacer is used. In other embodiments, the hard mask may be a bilayer, such as an $SiO_2/Si_3N_4$ bilayer, an $Al_2O_3/Si_3N_4$ bilayer and a $TiO_2/Si_3N_4$ bilayer. The removal of the hard mask may be performed using an HF solution, with which SiCO does not react, or via ALE. Thus, by proper selection of the hard mask materials and removal chemistries, a hard mask that protects the n-FET device regions from processes such as a UVLT anneal in the desired ambient, that is thin and that can be selectively removed from the fin and spacers may be provided in step 136.

A cleaning process is performed to remove oxides on the surface of the Si fins for the p-FET devices, via step 138. Step 138 is analogous to step 118 of the method 110. The processes described above for the method 110 may be used for step 138.

Figure 6A:
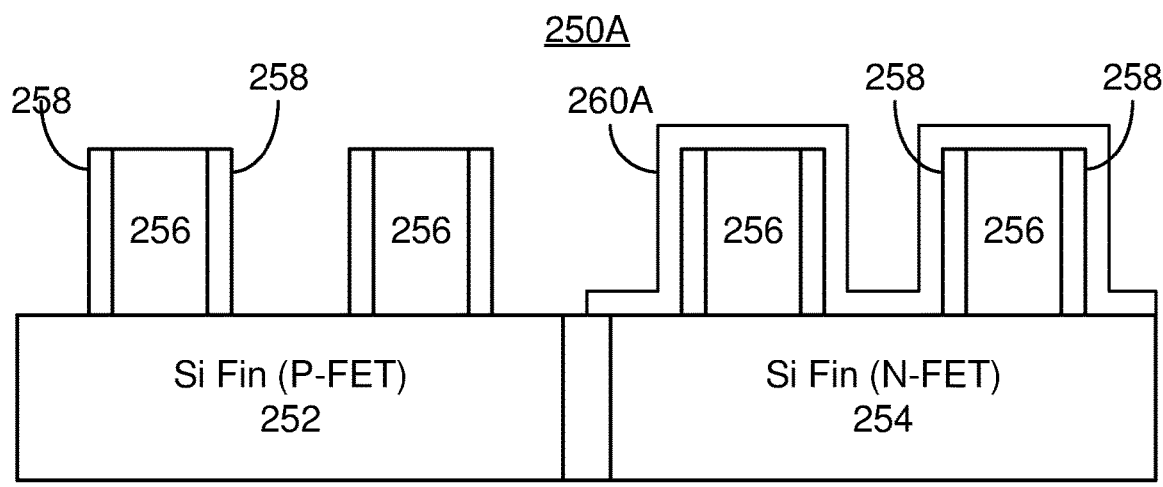
FIGS. 6A-6D depict portions of an exemplary embodiment of a CMOS device during fabrication.

FIG. 6A depicts the CMOS device 250A after step 138 is performed. The fins 252 for the p-FET devices as well as the fins 254 for the n-FET devices have been formed. The fins 252 and 254 are undoped Si in the embodiment shown. Also shown are dummy gates 256 and spacers 258. For clarity, only some of the spacers 258 are labeled. Hard mask 260A has also been provided on the fin 254 for the n-FET devices. As discussed above, the material(s) selected for the hard mask 260A depend upon the materials used for the spacers 258. Thus, the hard mask 260A may be removable from the Si fin 252 and spacers 258 but protects the fin 254 from the UVLT anneal described below. In addition, step 138 has removed any native oxides from the exposed regions of the fin 252 adjacent to the spacers 258. These structures may be formed on a wafer (not explicitly shown). The wafer may include but is not limited to silicon, a silicon-comprising material (e.g. including Si or SiGe) on SRB (strain relieved SiGe buffer), SOI (silicon on insulator), strained SOI (sSOI), or strained SiGeOI (sSiGeOI) with various orientations including but not limited (100) and (110). The Si fin 252 corresponds to the semiconductor underlayer 252 of FIGS. 2A-2C and the method 100.

Figure 6B:
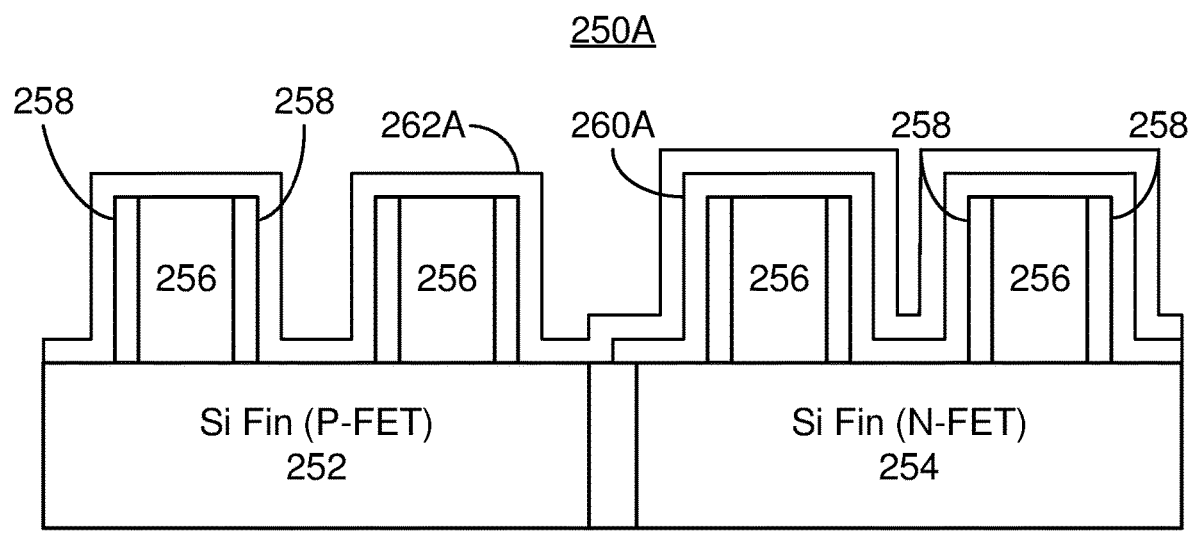

A highly p-doped Si layer is deposited on the device 250A, via step 140. The silicon layer may be amorphous silicon and/or polysilicon in some embodiments. The p-type dopant may be B and/or another p-type dopant. FIG. 6B depicts the CMOS device 250A after step 140 is performed. Thus, a p-doped Si layer 262A has been deposited on both the n-FET fin 254 and the p-FET fin 252. However, the p-doped Si layer 262A does not contact the Si fin 254 because of the hard mask 260A. In some embodiments, the p-doped Si layer 262A has at thickness of at least one nanometer and not more than ten nanometers. For example, the thickness may be nominally three nanometers through ten nanometers. In some embodiments, the thickness of the p-doped Si layer 262A is at least one nanometer and not more than five nanometers thick. The p-doped Si layer 262A corresponds to the doped semiconductor layer 220 of FIGS. 2A-2C and the method 100.

A UVLT anneal of the p-doped Si layer 262A is performed in an ambient that can drive the p-type dopant into the Si fin 252, via step 142. Because the anneal is assisted by ultraviolet light, a lower anneal temperature may be used. The low anneal temperature may be at least four hundred degrees Celsius and not more than seven hundred degrees Celsius. In some embodiments, the anneal temperature is at least five hundred degrees Celsius. The maximum anneal temperature may be six hundred degrees Celsius in some embodiments. Such lower anneal temperatures are still capable of driving the dopant(s) in the p-doped Si layer 262A with the assistance provided by the ultraviolet light.

The p-doped Si layer 262A is desired to be nitrided in the method 130. Consequently, a nitriding ambient is used in step 142. For example, nitrogen with a UV-assist may be used in the UVLT anneal. As a result, some or all of the p-doped Si layer 262A may be converted to a sacrificial nitride layer in step 142. A noble gas, such as argon, may also be flowed near the end of the UVLT anneal to ensure that the silicon in the p-doped Si layer 262A is consumed. In some such embodiments, all of the p-doped Si layer 262A is consumed in step 142. Thus, the p-doped Si layer 262A may be completely converted to a sacrificial nitride layer. In addition, the UVLT in the nitriding ambient effectively uses an effect analogous to the snow plow effect to drive the p-type dopant(s) from the p-doped Si layer 262A into the Si fin 252. Consequently, the Si fin 252 may be doped.

Figure 6C:
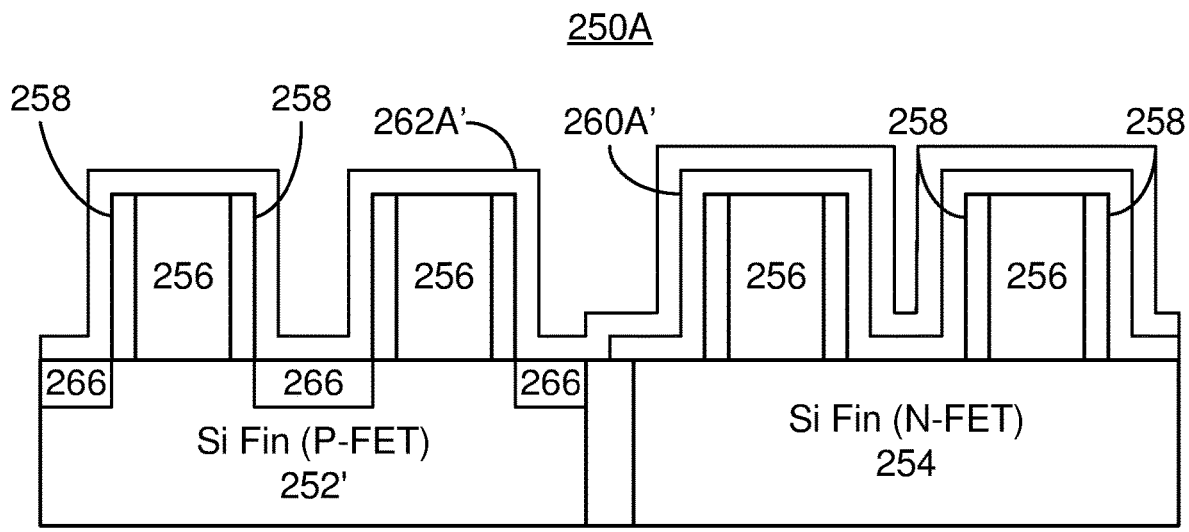

FIG. 6C depicts the CMOS device 250A after step 142 is performed. Thus, the p-doped Si layer 262A has reacted with the ambient to become a sacrificial nitride layer 262A'. In the embodiment shown, the p-doped Si layer 262A has been completely consumed. Thus, it has been replaced in FIG. 6C by sacrificial oxide layer 262A'. The Si fin 252' has p-doped regions 266 that include the p-type dopant(s) driven in from the p-doped Si layer 262A by the UVLT anneal. The doped regions 266 may be highly doped and have a sharp transition. For example, the concentration of the doped regions 266 may be $10^{19}/cm^3$-$10^{22}/cm^3$. In some such embodiments, the dopant concentration may be $10^{20}/cm^3$-$10^{21}/cm^3$. Other concentrations are possible. In some embodiments, the transitions for the doped regions 264 may be on the order of 2 nm/decade or sharper. Other transitions may also be possible in alternate embodiments.

Figure 6D:
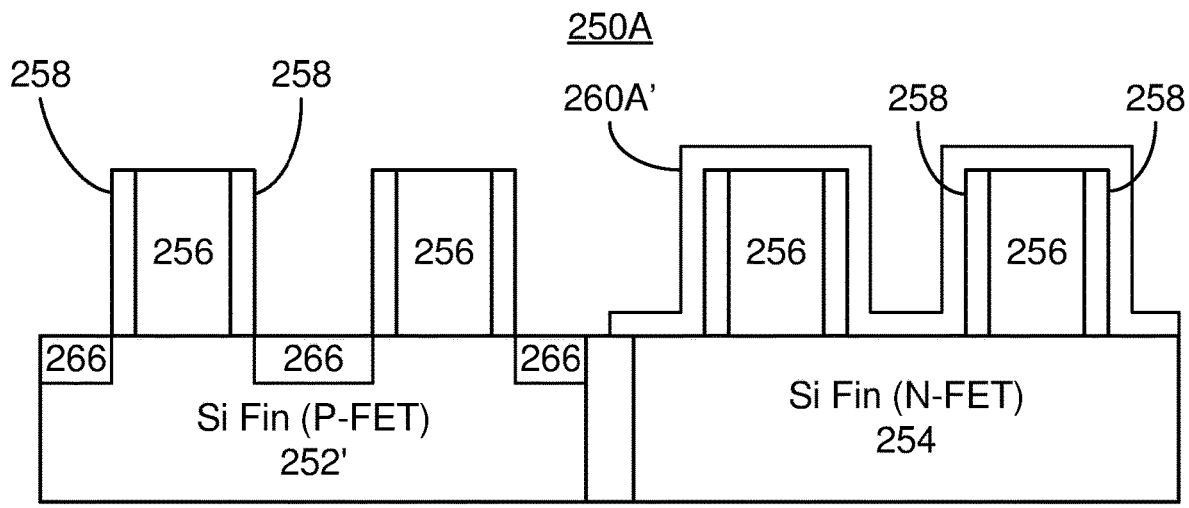

The sacrificial nitride layer 262A' is removed, via step 144. The appropriate removal chemistry and process for a nitride may be used in step 144. Further, the removal process has a high selectivity with respect to the underlying doped Si fin 254 and spacers 258. For example, ALE may be used to remove the nitride sacrificial layer 262A' without damaging the underlying structures 252' and 258. FIG. 6D depicts the CMOS device 250A after step 144 is performed. Thus, the sacrificial nitride layer 262A' has been removed. The Si fin 252' with highly doped, sharp transition junctions 266, spacers 258 and dummy gates 256 remain.

Fabrication of the CMOS device may then be completed, via step 146. For example, a metal wraparound contacts may then be provided on the regions 266. In some embodiments, the metal contact may be formed of material(s) such as Ti, W, Co, or Cu and may be at least three nanometers and not more than ten nanometers thick. Alternatively, rSD technology may be used to form a highly doped source and drain. If a SB-CMOS device is to be formed, a noble metal such as Ni, Pd and/or Co may be provided on the doped Si fin 252'. In some embodiments, the metal is at least one nanometer and not more than ten nanometers thick. Subsequent metals, such as W or TiN, may be deposited later to complete the source drain formation of the SB-CMOS device. Other devices may also be formed from the Si fin 252' including highly doped, sharp transition regions 266.

The method 130 drives dopant into the Si fin 252. As a result, a high doping concentration, sharp transition junctions 266 may be formed. The high dopant concentration and junction steepness may be provided for p-type finFET devices used at scaled down nodes. Thus, a very high doping concentration and very steep junction transitions for CMOS devices such as CMOS finFETs at very can be obtained at very low characteristic distances. Performance of devices that have been scaled up may, therefore, be enhanced.

Various features have been described with respect to the methods 100, 110 and 130 and the devices 200, 250 and 250A. One of ordinary skill in the art will recognize that these features may be combined in manner(s) not shown and which are not inconsistent with the devices and methods described herein.

Figure 7:
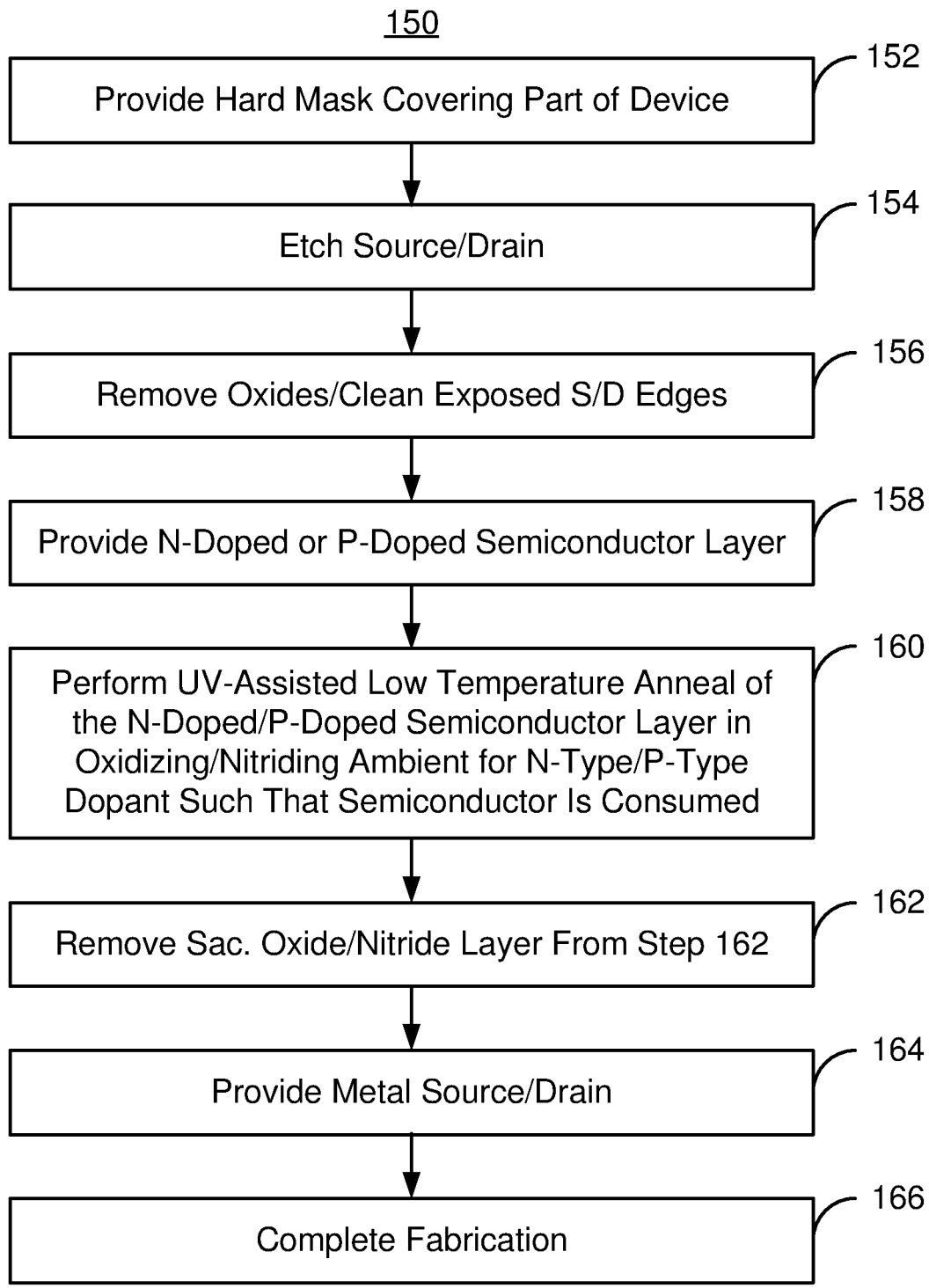
FIG. 7 is a flow chart depicting an exemplary embodiment of a method for providing a SB-devices.

FIG. 7 is a flow chart depicting an exemplary embodiment of a method 150 for providing a SB-CMOS device. For simplicity, some steps may be omitted, performed in another order and/or combined. Further, the method 150 may start after other steps in forming the semiconductor device have been performed. FIGS. 8A-8D depict portions of an exemplary embodiment of a SB-CMOS device 270 during fabrication using the method 150. For simplicity, not all components are shown in FIGS. 8A-8D. FIGS. 8A-8D are not to scale. Consequently, the method 150 is described in the context of the SB semiconductor device 270. The method 150 may start after a number of other steps have been performed in fabricating the CMOS device 270.

A hard mask is provided, via step 152. The hard mask covers the regions in which devices of one dopant type are formed, but exposes the regions in which devices of the other dopant type are formed. For example, if n-type SB devices are formed using the method 150, then the hard mask provided in step 152 covers regions in which p-type devices are formed. Conversely, if p-type SB devices are formed, then the mask provided in step 152 covers regions where n-type devices are formed. The hard mask provided in step 152 is desired to not only protect the portion of the devices from the processes carried out for formation of the doped regions, described below, but also be selectively removable from the silicon fin/channel and spacers. One of the processes to be carried out below is a UVLT anneal in an ambient such as an oxidizing ambient or a nitriding ambient. The hard mask may be desired to be highly resistant to oxidation or nitridation. Moreover, the selectivity for removal between the hard mask and underlying structures is desired to be high. The hard mask is also desired to be highly conformal and thin. For example, on the hard mask may be the order of at least one or two nanometers and not more than ten nanometers thick. In some embodiments, the hard mask is desired to be not more than five nanometers thick.

For example, a hard mask such as SiCO, $Al_2O_3$, $TiO_2$, $SiO_2$, TiN, TaN, $Si_3N_4$, $TiO_2$ or like materials may be used depending upon the underlying structures. In other embodiments, the hard mask may be a bilayer, such as an $SiO_2$/$Si_3N_4$ bilayer, an $Al_2O_3$/$Si_3N_4$ bilayer and a $TiO_2$/$Si_3N_4$ bilayer. The hard mask may be removable via ALE, a wet etch or other process that does not adversely impact the underlying structures. Thus, by proper selection of the hard mask materials and etch chemistries, a hard mask that protects the regions of the desired dopant type from processes such as a UVLT anneal in the desired ambient, that is thin and that can be selectively removed may be provided in step 152.

The source and drain regions are etched, via step 154. Metal source and drain structures are provided later because the device 270 being fabricated is an SB-CMOS device. A cleaning process is performed to remove oxides on the exposed edges of the source and/or drain regions, via step 156. Step 156 is analogous to steps 118 and 138 of the methods 110 and 130. The processes described above for the method 110 may be used for step 156.

Figure 8A:
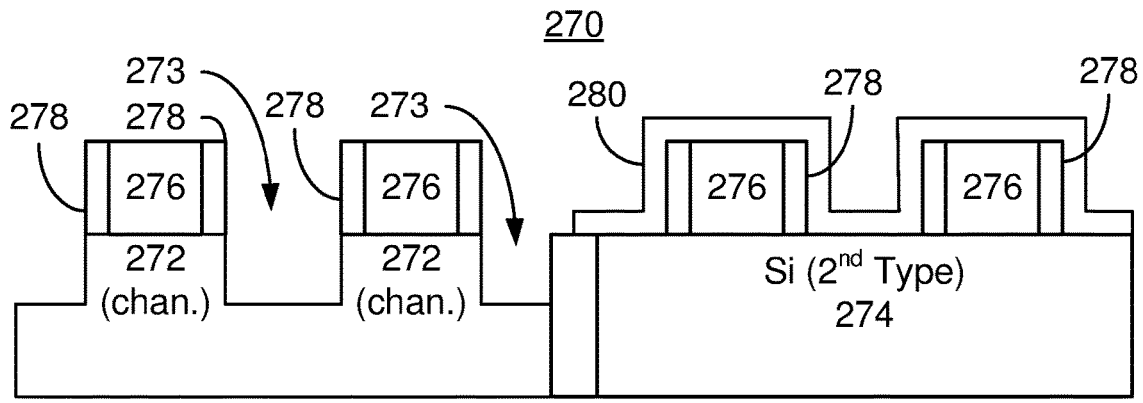
FIGS. 8A-8D depict portions of an exemplary embodiment of a CMOS SB-device device during fabrication.

FIG. 8A depicts the SB-CMOS device 270 after step 156 is performed. The channels 272 for the devices being fabricated are shown. These channels may be seen as having a first conductivity/dopant type. Also shown is the channel material 274 for the remaining devices. This channel material 274 has the opposite conductivity/dopant type as the channel 272. For example, if the channel 272 is for n-type devices, then the material 274 is for p-type devices. Conversely, if the channel 272 is for p-type devices, then the material 274 is for n-type devices. The SB-CMOS device 270 also includes gates 276 and insulator 278. Hard mask 280 has also been provided on the region 274. As discussed above, the material(s) selected for the hard mask 280 depend upon the materials used for the spacers 258. Thus, the hard mask 280 may be removable from the structures 272, 274, 276 and 278 but protects structure 274 from the UVLT anneal described below. Step 154 has formed trenches 273 (of which only two are labeled for simplicity). Step 156 has removed any native oxides from the exposed edges of the trenches 273. These structures may be formed on a wafer (not explicitly shown). The wafer may include but is not limited to silicon, a silicon-comprising material (e.g. including Si or SiGe) on SRB (strain relieved SiGe buffer), SOI (silicon on insulator), strained SOI (sSOI), or strained SiGeOI (sSiGeOI) with various orientations including but not limited (100) and (110). The channel material 272 corresponds to the semiconductor underlayer 252 of FIGS. 2A-2C and the method 100.

Figure 8B:
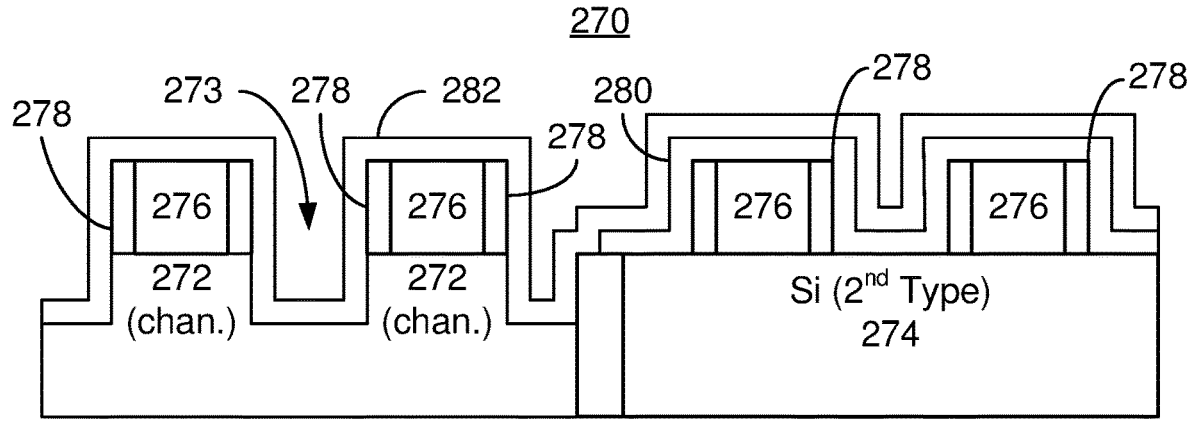

A highly doped Si layer is deposited on the device 270, via step 158. The silicon layer may be amorphous silicon and/or polysilicon in some embodiments. The type of the dopant depends upon the channel 272 and devices being formed. For n-type SB devices, the n-type dopant may be P, As, Sb and/or another n-type dopant. For p-type SB devices, the p-type dopant may be B and/or another p-type dopant. FIG. 8B depicts the SB device 280 after step 158 is performed. Thus, a doped Si layer 282 has been deposited on both the trenches 273 adjoining the channel 272 having the first conductivity type and the second type 274 of devices. However, the doped Si layer 282 does not contact the Si 274 because of the hard mask 280. In some embodiments, the doped Si layer 282 has at thickness of at least one nanometer and not more than ten nanometers. For example, the thickness may be nominally three nanometers through ten nanometers. In some embodiments, the thickness of the doped Si layer 282 is at least one nanometer and not more than five nanometers thick. The doped Si layer 282 corresponds to the doped semiconductor layer 220 of FIGS. 2A-2C and the method 100.

A UVLT anneal of the doped Si layer 282 is performed in an ambient that can drive the dopant into the channel 272, via step 160. Because the anneal is assisted by ultraviolet light, a lower anneal temperature may be used. The low anneal temperature may be at least four hundred degrees Celsius and not more than seven hundred degrees Celsius. In some embodiments, the anneal temperature is at least five hundred degrees Celsius. The maximum anneal temperature may be six hundred degrees Celsius in some embodiments. Such lower anneal temperatures are still capable of driving the dopant(s) in the doped Si layer 282 with the assistance provided by the ultraviolet light.

The doped Si layer 282 is desired to be oxidized or nitrided in the method 180. For an n-type dopant of the Si layer 282, an oxidizing ambient is used in step 160. For example, steam or ozone, with or without UV-assist may be used in the UVLT anneal. For a p-type dopant in the Si layer 282, a nitriding ambient is used in step 160. For example, nitrogen with a UV-assist may be used in the UVLT anneal. As a result, some or all of the doped Si layer 282 may be converted to a sacrificial oxide layer or a sacrificial nitride layer in step 160. A noble gas, such as argon, may also be flowed near the end of the UVLT anneal to ensure that the silicon in the doped Si layer 282 is consumed. In some such embodiments, all of the doped Si layer 282 is consumed in step 160. Thus, the doped Si layer 282 may be completely converted to a sacrificial oxide layer or a sacrificial nitride layer. In addition, the UVLT in the oxidizing or nitriding ambient effectively uses an effect analogous to the snow plow effect to drive the n-type or p-type dopant(s) from the doped Si layer 282 into the channel 272. Consequently, the edges of the channel 272 may be doped.

Figure 8C:
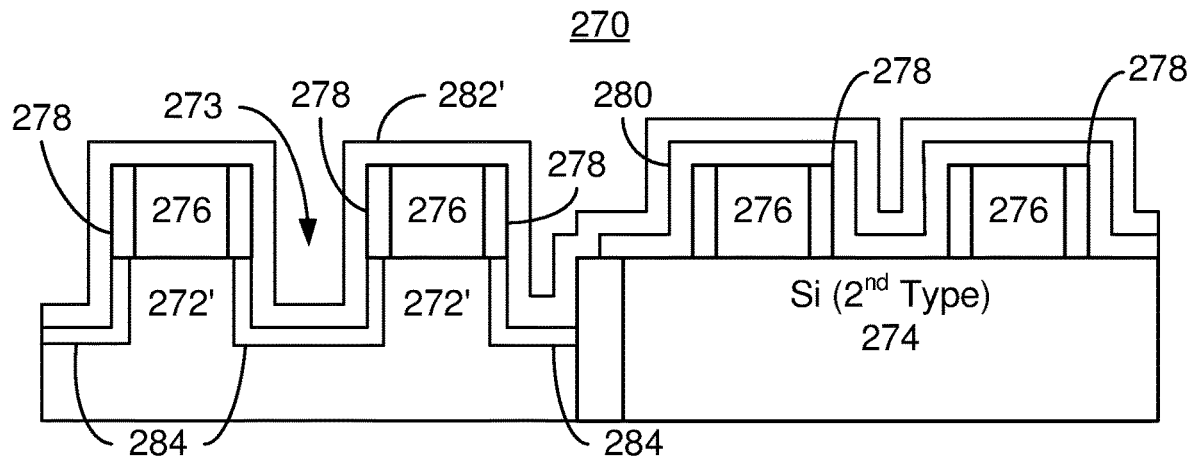

FIG. 8C depicts the SB-device 270 after step 160 is performed. Thus, the doped Si layer 282 has reacted with the ambient to become a sacrificial oxide or nitride layer 282'. In the embodiment shown, the doped Si layer 282 has been completely consumed. Thus, it has been replaced in FIG. 8C by sacrificial oxide/nitride layer 282'. The channel 272' has n-doped regions 284 that include the dopant(s) driven in from the doped Si layer 282 by the UVLT anneal. The doped regions 286 may be highly doped and have a sharp transition. For example, the concentration of the doped regions 286 may be $10^{19}/cm^3$-$10^{22}/cm^3$. In some such embodiments, the dopant concentration may be $10^{20}/cm^3$-$10^{21}/cm^3$. Other concentrations are possible. In some embodiments, the transitions for the doped regions 264 may be on the order of 2 nm/decade or sharper. Other transitions may also be possible in alternate embodiments.

The sacrificial oxide or nitride layer 282' is removed, via step 162. The appropriate removal chemistry and process for an oxide or the appropriate removal chemistry and process for a nitride may be used in step 162. Further, the removal process has a high selectivity with respect to the underlying doped channel regions 284 and other structures 272, 274 and 276. For example, ALE may be used to remove an oxide or nitride sacrificial layer 284' without damaging the underlying structures 272', 284, 278 and 280. Such a step would expose the trenches 273. Thus, the metal source and/or drain may be deposited, via step 166. Thus, a SB device is formed.

Figure 8D:
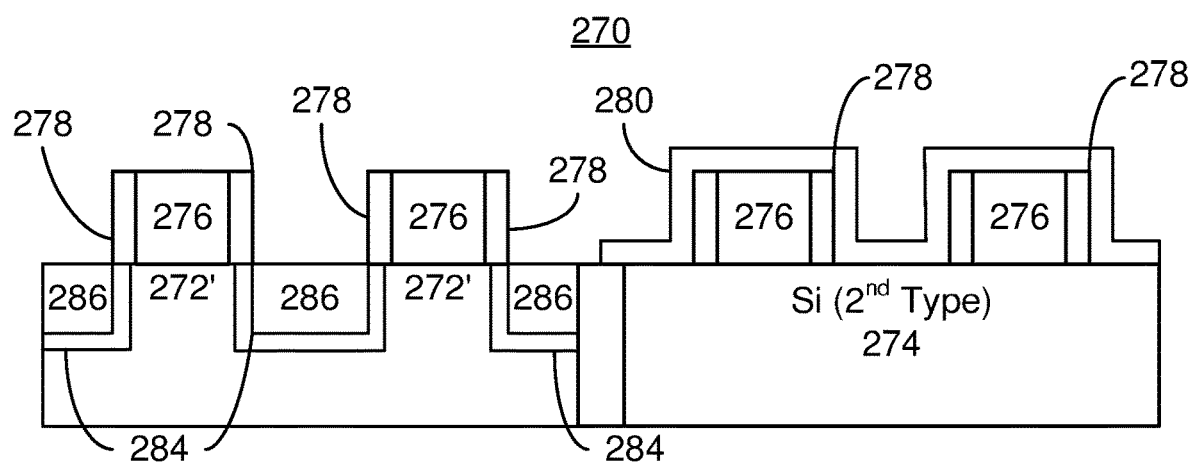

FIG. 8D depicts the CMOS device 280 after step 164 is performed. Thus, the sacrificial nitride layer 282' has been removed. Metal sources and/or drains 286 have also been formed. Further, the edges of the channel 272' have been doped. These regions 284 may be highly doped and have sharp transition junctions. Consequently, the magnitude of the Schottky barrier may be mitigated.

The method 150 drives dopant into the channel 272. As a result, a high doping concentration, sharp transitions regions 284 may be formed between the metal source/drains 286 and the channel 272'. This may reduce the size of the Schottky barrier for the SB devices 270. Performance of SB devices 270 may thus be enhanced.

Various features have been described with respect to the methods 100, 110, 130 and 150 and the devices 200, 250, 250A and 280. One of ordinary skill in the art will recognize that these features may be combined in manner(s) not shown and which are not inconsistent with the devices and methods described herein.

A method and system for providing CMOS devices having highly doped steep junctions at lower-sized nodes has been described. The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

We claim:

1. A method for providing a semiconductor device comprising:
depositing a doped semiconductor layer on a semiconductor underlayer, at least a portion of the semiconductor underlayer being exposed for the doped semiconductor layer depositing step, a dopant for the doped semiconductor layer being selected from a p-type dopant and an n-type dopant;
performing an ultraviolet-assisted low temperature (UVLT) anneal of the doped semiconductor layer in an ambient, the ambient being selected from an oxidizing ambient and a nitriding ambient, the oxidizing ambient being used for the n-type dopant, the nitriding ambient being used for the p-type dopant, a sacrificial layer being formed by the doped semiconductor layer during the UVLT anneal and the dopant being driven into the at least the portion of the semiconductor underlayer from the doped semiconductor layer by the UVLT anneal to from a doped semiconductor underlayer; and
removing the sacrificial layer.

2. The method of claim 1 wherein the semiconductor device includes a first region and a second region, the first region corresponding to a first plurality of devices having the n-type dopant, the second region corresponding to a second plurality of devices having the p-type dopant, the method comprising:
covering the first region with a mask before the depositing the doped semiconductor layer if the dopant is a p-type dopant and covering the second region with a mask before the depositing the doped semiconductor layer if the dopant is the n-type dopant, the mask withstanding the UVLT anneal.

3. The method of claim 2 wherein the mask is a hard mask including at least one of an $SiO_2$ layer, an $Al_2O_3$ layer, a $TiO_2$ layer, a TiN layer, a TaN layer, $Si_3N_4$ layer, an $SiO_2/Si_3N_4$ bilayer, an $Al_2O_3/Si_3N_4$ bilayer and a $TiO_2/Si_3N_4$ bilayer.

4. The method of claim 2 wherein the first plurality of devices is a first plurality of finFETs, the second plurality of devices is a second plurality of finFETs and the semiconductor underlayer is a fin for each of the first plurality of devices and the second plurality of devices.

5. The method of claim 1 wherein the doped semiconductor layer is a doped Si layer and the semiconductor underlayer is an undoped Si underlayer.

6. The method of claim 1 wherein an anneal temperature for the UVLT anneal is at least four hundred degrees Celsius and not more than seven hundred degrees Celsius.

7. The method of claim 1 wherein UVLT anneal performing step further provides a doping concentration in the doped semiconductor underlayer of at least $1\times10^{19}/cm^3$ and not more than $1\times10^{22}/cm^3$.

8. The method of claim 1 wherein the n-type dopant includes at least one of P, As and Sb and the p-type dopant includes B.

9. The method of claim 1 wherein the UVLT anneal performing step further includes:
ensuring that the doped semiconductor layer is completely consumed such that the sacrificial layer includes all of the semiconductor layer.

10. The method of claim 1 further comprising:
providing metal layer after the layer UVLT anneal performing step.

11. The method of claim 1 wherein the doped semiconductor underlayer forms a portion of a channel, the method further comprising:
forming a metal source and a metal drain.

12. A method for providing a semiconductor device comprising:
providing an undoped silicon fin for each of a plurality of CMOS devices in a first region and a second region, the first region corresponding to a plurality of n-FET devices, the second region corresponding to a plurality of p-FET devices;
providing a dummy gate and a spacer on the undoped fin for each of the plurality of CMOS devices;
covering the first region with a hard mask if the p-FET devices are to be formed;
covering the second region with the hard mask if the n-FET devices are to be formed;
cleaning a region exposed by the hard mask;
providing a doped Si layer on the undoped Si fin, a dopant for the doped semiconductor layer being selected from a p-type dopant and an n-type dopant, the p-type dopant being selected if the p-FET devices are to be formed, the n-type dopant being selected if the n-FET devices are to be formed;
performing an ultraviolet-assisted low temperature (UVLT) anneal of the doped Si layer in an ambient, the ambient being selected from an oxidizing ambient and a nitriding ambient, the oxidizing ambient being used if the n-FET devices are being formed, the nitriding ambient being used if the p-FET devices are being formed, a sacrificial layer being formed by the doped Si layer during the UVLT anneal and the dopant being driven into the at least the portion of the undoped Si fin from the doped Si layer by the UVLT anneal to from a doped Si fin, the sacrificial layer being a nitride layer if the nitriding ambient is used, the sacrificial layer being an oxide if the oxidizing ambient is used; and
removing the sacrificial layer.

13. A semiconductor device comprising:
a plurality of CMOS devices, each of the plurality of CMOS devices including a doped structure formed by depositing a doped semiconductor layer on a semiconductor underlayer at least a portion of which is exposed, performing an ultraviolet-assisted low temperature (UVLT) anneal of the doped semiconductor layer in an ambient thereby forming a sacrificial layer from the doped semiconductor layer and removing the sacrificial layer, a dopant for the doped semiconductor layer being selected from a p-type dopant and an n-type dopant, the ambient being selected from an oxidizing ambient and a nitriding ambient, the oxidizing ambient being for the n-type dopant, the nitriding ambient being for the p-type dopant, the dopant being driven into the at least the portion of the semiconductor underlayer from the doped semiconductor layer by the UVLT anneal to from a doped semiconductor underlayer, at least a portion of the doped structure being formed by the doped semiconductor underlayer, the doped structure including at least one of a dopant concentration of at least $10^{19}/cm^3$ and an edge transition in the dopant concentration of at least two nanometers per decade.

14. The semiconductor device of claim 13 wherein the plurality of CMOS devices are a plurality of n-FETs, the dopant being the n-type dopant.

15. The semiconductor device of claim 13 wherein the plurality of CMOS devices are a plurality of p-FETs, the dopant being the p-type dopant.

16. The semiconductor device of claim 13 wherein the plurality of devices is a plurality of finFETS and the semiconductor underlayer is a fin for each of the plurality of CMOS devices.

17. The semiconductor device of claim 13 wherein the doped semiconductor layer is a doped Si layer and the semiconductor underlayer is an undoped Si underlayer.

18. The semiconductor device of claim 13 wherein a doping concentration in the doped semiconductor underlayer is at least $1 \times 10^{19}/cm^3$ and not more than $1 \times 10^{22}/cm^3$.

19. The semiconductor device of claim 13 wherein the n-type dopant includes at least one of P, As and Sb and the p-type dopant includes B.

20. The semiconductor device of claim 13 wherein the doped semiconductor underlayer forms a portion of a channel and wherein each of the plurality of devices includes a metal source and a metal drain.

21. The method of claim 1, wherein the doped semiconductor layer has a first surface adjoining the semiconductor layer and a second surface opposite to the first surface and wherein the performing the UVLT anneal further includes:
exposing the second surface to the ambient during the UVLT anneal, such that at least a portion of the doped semiconductor layer is converted to the sacrificial layer, the dopant having a first solubility in the semiconductor underlayer and a second solubility in the sacrificial layer, the first solubility being greater than the second solubility such that conversion of the at least the portion of the doped semiconductor layer to the sacrificial layer drives the dopant into the semiconductor underlayer.

22. The method of claim 12, wherein the doped semiconductor layer has a first surface adjoining the semiconductor layer and a second surface opposite to the first surface and wherein the performing the UVLT anneal further includes:
exposing the second surface to the ambient during the UVLT anneal, such that at least a portion of the doped semiconductor layer is converted to the sacrificial layer, the dopant having a first solubility in the semiconductor underlayer and a second solubility in the sacrificial layer, the first solubility being greater than the second solubility such that conversion of the at least the portion of the doped semiconductor layer to the sacrificial layer drives the dopant into the semiconductor underlayer.

23. The semiconductor device of claim 13, wherein the doped semiconductor layer has a first surface adjoining the semiconductor layer and a second surface opposite to the first surface and wherein the doped structure further is formed by:
exposing the second surface to the ambient during the UVLT anneal, such that at least a portion of the doped semiconductor layer is converted to the sacrificial layer, the dopant having a first solubility in the semiconductor underlayer and a second solubility in the sacrificial layer, the first solubility being greater than the second solubility such that conversion of the at least the portion of the doped semiconductor layer to the sacrificial layer drives the dopant into the semiconductor underlayer.

24. The method of claim 1, wherein the doped semiconductor layer has a first surface adjoining the semiconductor layer and a second surface opposite to the first surface, the doped semiconductor layer being substantially free of the ambient between the first surface and the second surface as-deposited.

* * * * *